US011489346B2

(12) United States Patent
Tabatowski-Bush et al.

(10) Patent No.: US 11,489,346 B2
(45) Date of Patent: Nov. 1, 2022

(54) AUTOMOTIVE BATTERY SYSTEM CONTROL ACCORDING TO CORRECTED TOP CELL VOLTAGE

(71) Applicant: Ford Global Technologies, LLC, Dearborn, MI (US)

(72) Inventors: Benjamin A. Tabatowski-Bush, Ann Arbor, MI (US); Baojin Wang, Ypsilanti, MI (US); John Paul Gibeau, Canton, MI (US); Ai Keramidas, West Bloomfield, MI (US); Kimberley King, Northville, MI (US); Daniel Paul Roberts, Livonia, MI (US); Aaron Walker, Auburn Hills, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 282 days.

(21) Appl. No.: 16/547,827

(22) Filed: Aug. 22, 2019

(65) Prior Publication Data
US 2021/0053462 A1    Feb. 25, 2021

(51) Int. Cl.
*H02J 7/00* (2006.01)
*B60L 58/22* (2019.01)

(52) U.S. Cl.
CPC .......... *H02J 7/0014* (2013.01); *B60L 58/22* (2019.02); *H02J 7/0026* (2013.01); *B60L 2240/36* (2013.01); *B60Y 2200/91* (2013.01)

(58) Field of Classification Search
CPC .................................................. H02J 7/0014
USPC ........................................................ 320/119
See application file for complete search history.

(56) References Cited

U.S. PATENT DOCUMENTS

| 2014/0306662 A1 | 10/2014 | Kim et al. | |
| 2015/0022213 A1* | 1/2015 | Chandler | G01R 31/374 324/426 |
| 2016/0116511 A1* | 4/2016 | Yang | G01R 19/32 324/105 |

FOREIGN PATENT DOCUMENTS

CN    104104130 B    11/2016

* cited by examiner

*Primary Examiner* — Eric D Lee
(74) *Attorney, Agent, or Firm* — David B. Kelley; Brooks Kushman P.C.

(57) ABSTRACT

A vehicle has a battery including a plurality of cells connected in series, and a battery management integrated circuit including a plurality of inputs each being directly electrically connected to a terminal of one of the cells via an electrical path that includes a fuse and a resistor connected in series. The battery management integrated circuit further includes a top input directly electrically connected to a positive output of the battery and configured to receive power from the battery that is defined by a current having a magnitude that is at least an order of magnitude greater than current received by the inputs and a voltage equal to a sum of voltages of all the cells. The battery management integrated circuit is configured to calculate a voltage difference between one of the inputs and an adjacent one of the inputs to determine a voltage of a top cell of the battery cells and to correct the voltage of the top cell to form a corrected voltage as a sum of the voltage of the top cell and a calculated voltage drop across the fuse in the electrical path between the top cell and the one of the inputs. The vehicle further has a controller programmed to balance the cells according to the corrected voltage of the top cell.

8 Claims, 4 Drawing Sheets

AUTOMOTIVE BATTERY SYSTEM CONTROL ACCORDING TO CORRECTED TOP CELL VOLTAGE

TECHNICAL FIELD

This disclosure relates to strategies for measuring cell voltages of a battery pack.

BACKGROUND

An automotive vehicle may include a battery to power an electric machine arranged to propel wheels of the vehicle. Control of the battery, including charge, discharge, and cell balance operations, may depend on voltages of cells of the battery.

SUMMARY

An automotive battery system has a battery including a plurality of cells connected in series and a battery management integrated circuit. The battery management integrated circuit includes a plurality of inputs each being directly electrically connected to a terminal of one of the cells via an electrical path such that a difference between voltages of an adjacent pair of the inputs corresponds to a voltage across one of the cells. Each of the paths includes a fuse and a resistor connected in series. The battery management integrated circuit further includes a top input directly electrically connected to a positive output of the battery and configured to receive power from the battery that is defined by a current having a magnitude that is at least an order of magnitude greater than current received by the inputs and a voltage equal to a sum of voltages of all the cells. The battery management integrated circuit is configured to calculate a voltage difference between one of the inputs and an adjacent one of the inputs to calculate a voltage of a top cell of the battery cells and to correct the voltage of the top cell to form a corrected voltage according to the magnitude that is at least an order of magnitude greater and a predetermined resistance of the fuse in the electrical path between the top cell and the one of the inputs. The automotive battery system also has a controller programmed to balance the cells according to the corrected voltage of the top cell.

An automotive battery system has a battery including a plurality of cells connected in series and a battery management integrated circuit. The battery management integrated circuit includes a plurality of inputs each being directly electrically connected to a terminal of one of the cells via an electrical path such that a difference between voltages of an adjacent pair of the inputs corresponds to a voltage across one of the cells. Each of the paths includes a fuse and a resistor connected in series. The battery management integrated circuit further includes a top input directly electrically connected to a positive output of the battery and configured to receive power from the battery that is defined by a current having a magnitude that is at least an order of magnitude greater than current received by the inputs and a voltage equal to a sum of voltages of all the cells, the method comprising. A method for controlling the automotive battery system includes calculating a voltage difference between one of the inputs and an adjacent one of the inputs to determine a voltage of a top cell of the battery cells, correcting the voltage of the top cell to form a corrected voltage according to the magnitude that is at least an order of magnitude greater and a predetermined resistance of the fuse in the electrical path between the top cell and the one of the inputs, and balancing the cells according to the corrected voltage of the top cell.

A vehicle has a battery including a plurality of cells connected in series, and a battery management integrated circuit including a plurality of inputs each being directly electrically connected to a terminal of one of the cells via an electrical path that includes a fuse and a resistor connected in series. The battery management integrated circuit further includes a top input directly electrically connected to a positive output of the battery and configured to receive power from the battery that is defined by a current having a magnitude that is at least an order of magnitude greater than current received by the inputs and a voltage equal to a sum of voltages of all the cells. The battery management integrated circuit is configured to calculate a voltage difference between one of the inputs and an adjacent one of the inputs to determine a voltage of a top cell of the battery cells and to correct the voltage of the top cell to form a corrected voltage as a sum of the voltage of the top cell and a calculated voltage drop across the fuse in the electrical path between the top cell and the one of the inputs. The vehicle further has a controller programmed to balance the cells according to the corrected voltage of the top cell.

DETAILED DESCRIPTION

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Pouch cells of vehicle battery packs may use fuses and/or resistors for short circuit protection. These components can lead to voltage drops during cell voltage measurement. Resistances associated with the fuses are typically in the range of a few ohms, and resistances associated with the resistors can be even less. If current therethrough is in the range of micro or nanoamps, the voltage drops are negligible. If however current therethrough is in the range of milliamps, the voltage drops may not be negligible.

Figure 1:
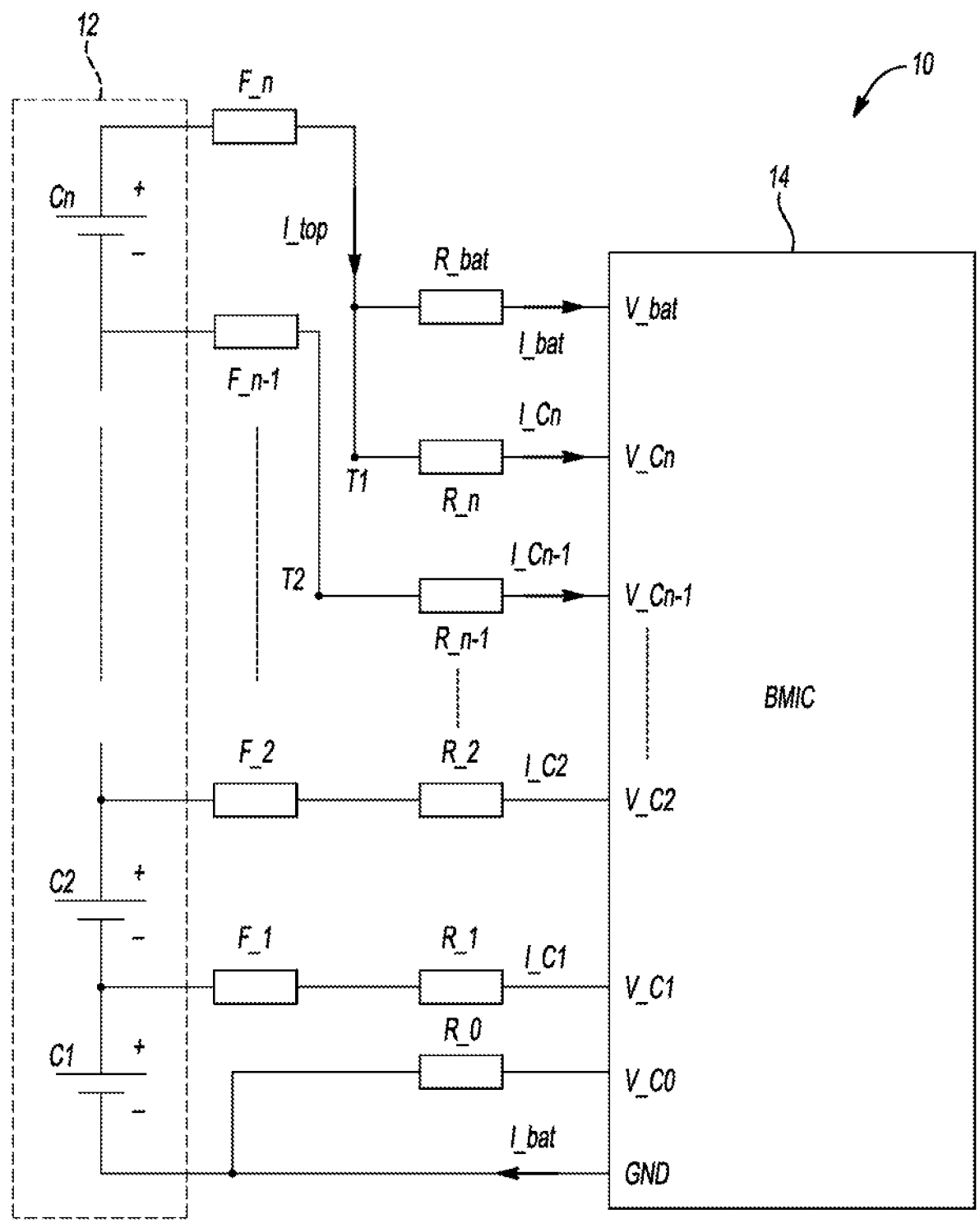
FIGS. 1 through 3 are schematic diagrams of vehicle battery systems.

Referring to FIG. 1, a battery system 10 includes a battery pack 12, a battery management integrated circuit 14, fuses F_1-F_n, resistors R_0-R_n, and resistor R_bat. The battery pack 12 includes series connected pouch cells C_1-Cn. The battery management integrated circuit includes inputs V_C0-V_Cn, as well as an output for ground GND and an input for powering the battery management integrated circuit 14 V_bat. The fuses F_1-F_n, resistors R_0-R_n, and resistor R_bat are electrically between the battery pack 12 and battery management integrated circuit 14 for short circuit protection as mentioned above.

Specifically, the fuse F_n and resistor R_bat are in series between a positive terminal of the cell Cn and the input V_bat. The fuse F_n and resistor R_n are in series between the positive terminal of the cell Cn and the input V_Cn. The fuse F_n−1 and resistor R_n−1 are in series between the positive terminal of the cell Cn−1 (not shown)/negative terminal of the cell Cn and the input V_Cn−1, and so on.

Currents flow from certain subsets of the cells C1-Cn through the short circuit protection components to the inputs V_C1-V_bat. Current at the potential of the cell C1 flows through the fuse F_1 and resistor R_1 to the input V_C1. Current at the combined (summed) potential of the cells C1 and C2 flows through the fuse F_2 and resistor R_2 to the input V_C2, and so on. Given this arrangement, the voltage of any cell of the battery pack 12 can be calculated as the difference between the voltage of two adjacent inputs. The voltage of the cell C2 is the difference between the voltage of the input V_C2 and the voltage of the input V_C1. The voltage of the cell Cn corresponds to the difference between the voltage of the input V_Cn and the voltage of the input V_Cn−1.

As mentioned above, resistances associated with the fuses F_1-F_n, resistors R_0-R_n, and resistor R_bat are in the range of Ohms. And, currents I_C1-Cn−1 are in the range of mica or nano amps. Thus, the voltage drops across the fuses F_1-F_n−1 and resistors R_0-R_n−1 are negligible. Current I_bat, however, is in the range of milliamps as it is the current used to power the battery management integrated circuit 14. Thus, the voltage drop across the fuse F_n is not negligible and would impact attempts at calculating the voltage of the cell Cn as the difference between the voltage of the input V_Cn and the voltage of the input V_Cn−1. The voltage drop across the resistor R_n is negligible as its resistance is relatively small even though I_Cn is in the range of milliamps: I_top is essentially equal to I_bat.

Here, techniques are proposed for taking account of the voltage drop across F_n to improve the accuracy of the voltage measurement of Cn ("the top cell.").

The amount of current to power the battery management integrated circuit 14 varies with operating temperature, and can be tested and determined in advance. That is, standard tests can be performed to determine how I_bat varies with temperature. Such data can be stored, for example, in a look-up table in the battery management integrated circuit 14 or in a controller accessible by the battery management integrated circuit 14, which can typically be configured to measure its operating temperature via temperature sensors. Standard tests can also be performed to determine the resistance of the fuse F_n. Such data can also be stored in the battery management integrated circuit 14 or in a controller accessible by the battery management integrated circuit 14.

Using Ohm's law, the voltage drop across the fuse F_n, $V_{F\_n}$, can be calculated as the product of the temperature-dependent current I_bat and the predetermined resistance of the fuse F_n. This voltage can then be added to the difference between the voltages at the inputs V_Cn and V_Cn−1. That is, the voltage $V_{Cn}$ is equal to $V_{F\_n}+(V\_Cn-Cn-1)$.

If in the alternative, the battery management integrated circuit 14 is not or cannot be configured to measure its operating temperature, I_bat can be determined by calculating the voltage drop, $V_{R\_bat}$, across the resistor R_bat as the difference between V_bat and V_Cn (assuming V_Cn≈$V_{T1}$), and using Ohm's law, I_bat can be calculated as the quotient of $V_{R\_bat}$ and R_bat, which can be determined in advance via standard testing techniques. $V_{Ca}$ can then be determined as described above.

Figure 2:
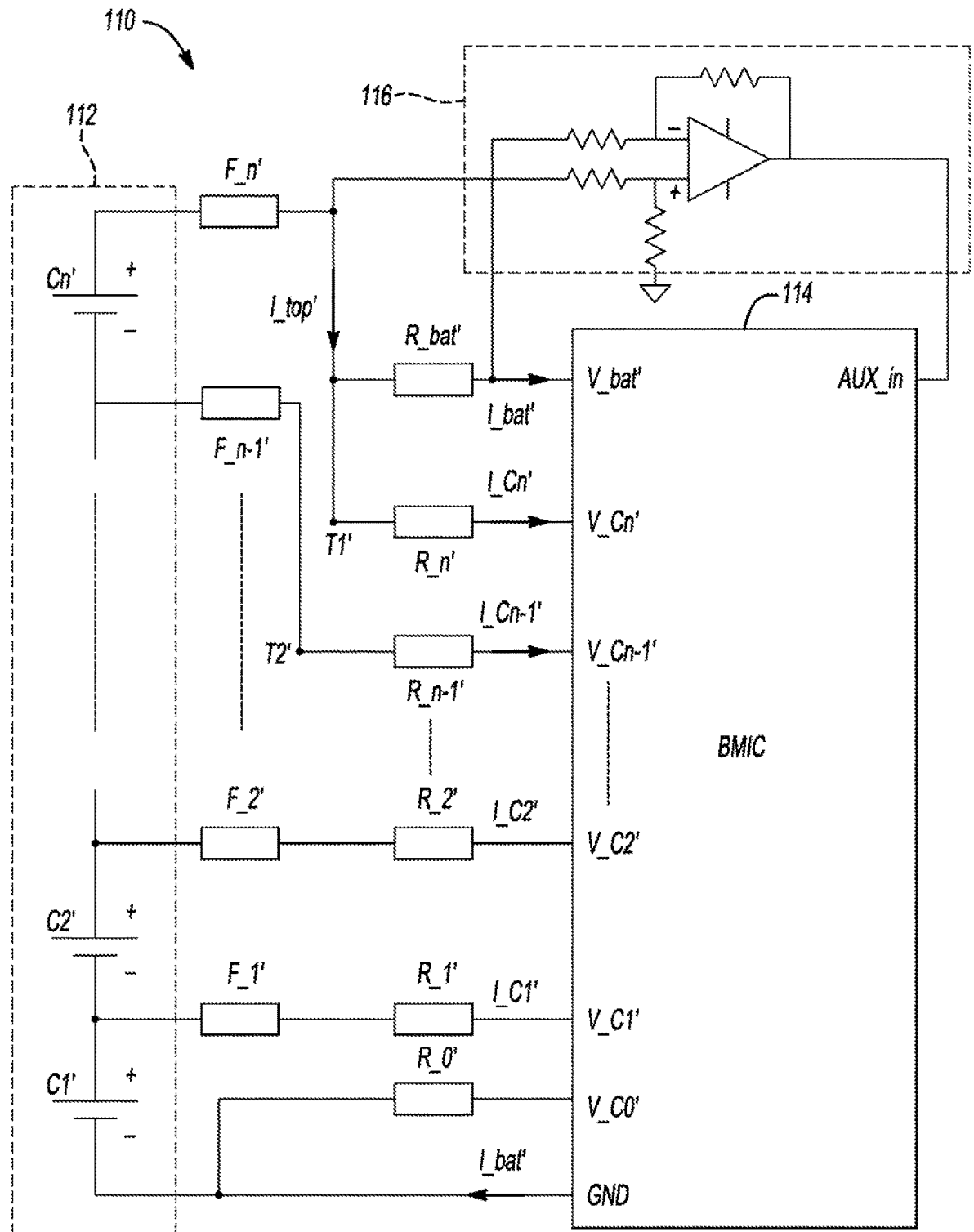

Referring to FIG. 2 in which similarly numbered elements have similar descriptions, a battery system 110 includes a battery pack 112, a battery management integrated circuit 114, an amplifier arrangement 116, fuses F_1'-F_n', resistors R_0'-R_n', and resistor R_bat'. The battery pack 12 includes series connected pouch cells C_1'-C_n'. The battery management integrated circuit 114 includes inputs V_C0'-V_Cn', as well as an output for ground GND', an input for powering the battery management integrated circuit 14 V_bat', and an auxiliary input, AUX_in. The fuses F_1'-F_n', resistors R_0'-R_n', and resistor R_bat' are electrically between the battery pack 112 and battery management integrated circuit 114 for short circuit protection.

Inputs to the amplifier arrangement 116 are connected to measure the voltage drop, $V_{R\_bat}$, across R_bat'. That is, one of the inputs to the amplifier arrangement 116 measures the voltage at the input V_Bat' and the other of the inputs to the amplifier arrangement 116 measures the voltage $V_{T1}$'. The output of the amplifier arrangement 116 is connected to the auxiliary input, AUX_in. Thus, in circumstances in which the battery management integrated circuit 114 is not or cannot be configured to measure V_bat' and is not or cannot be configured to measure its operating temperature, I_bat' can be determined, using Ohm's law, as the quotient of $V_{R\_bat}$' and R_bat', which can be determined in advance via standard testing techniques. $V_{Cn'}$ can then be determined as described above.

Figure 3:
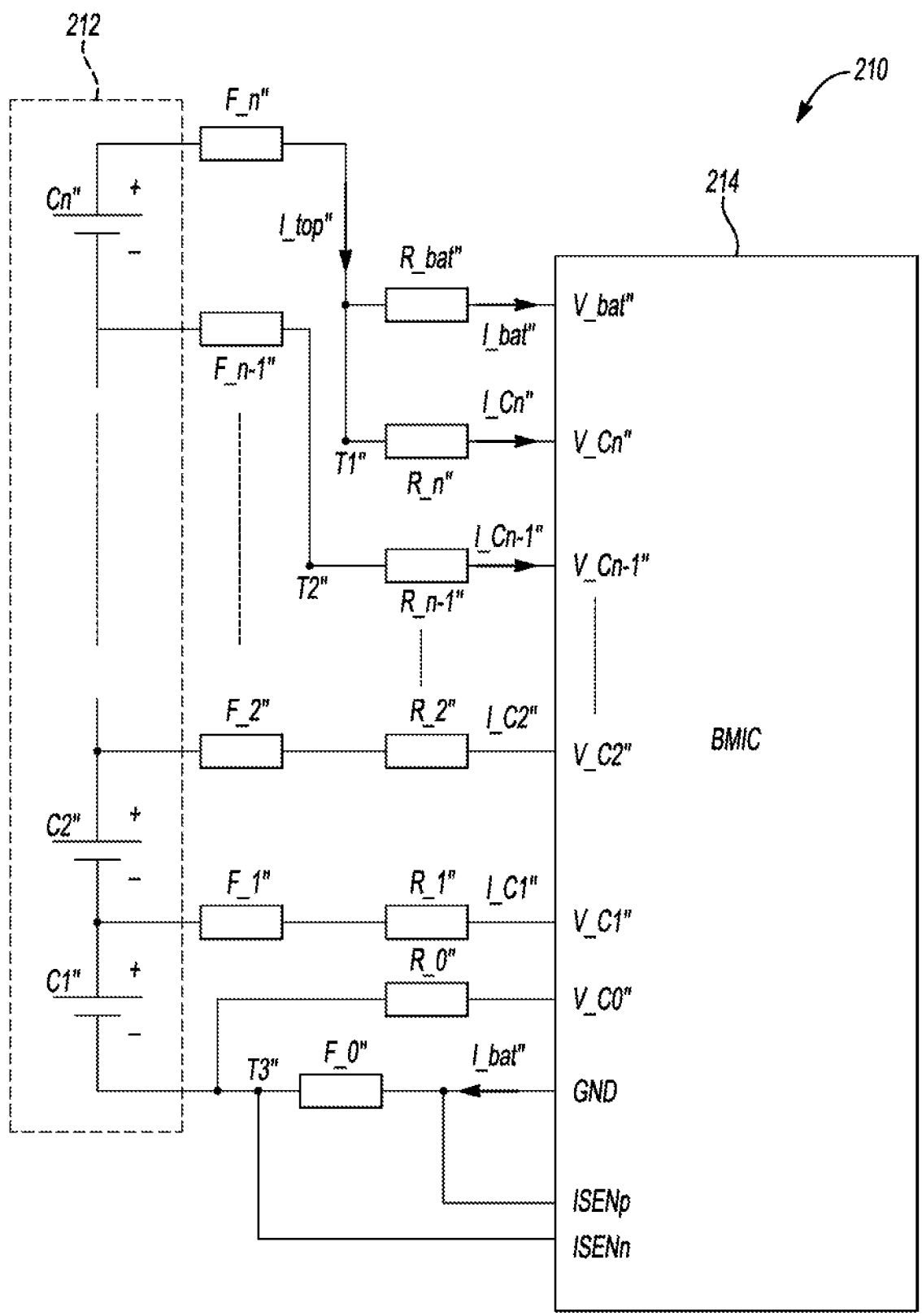

Referring to FIG. 3 in which similarly numbered elements have similar descriptions, a battery system 210 includes a battery pack 212, a battery management integrated circuit 214, fuses F_0"-F_n", resistors R_0"-R_n", and resistor R_bat". The battery pack 212 includes series connected pouch cells C_1"-C_n". The battery management integrated circuit 214 includes inputs V_C0"-V_Cn", as well as an output for ground GND", an input for powering the battery management integrated circuit 14 V_bat", and inputs for a differential amplifier internal to the battery management integrated circuit 14 ISENp", ISENn". The fuses F_1"-F_n", resistors R_0"-R_n", and resistor R_bat" are electrically between the battery pack 212 and battery management integrated circuit 214 for short circuit protection.

The inputs ISENp", ISENn" to the differential amplifier are connected to measure the voltage drop, VF_0", across F_0". That is, one of the inputs to the differential amplifier measures the voltage at the output for ground GND" and the other of the inputs to the differential amplifier measures the voltage T3. In this example, the fuse F_0" is selected to be the same as the fuse F_n". Assuming the current flowing into the input V_bat" is the same as the current flowing out of output GND, the voltage drop across F_n" can be estimated by calculating the voltage drop across F_O" as the difference between $V_{GND}$" and $V_{T3}$". This voltage drop can then be added to the difference between the voltage of the input V_Cn" and the voltage of the input V_Cn−1" to calculate the voltage of the cell VCn".

Individual cell voltages are considered when determining whether to balance cells of a battery pack. If for example, the difference in voltage between two cells exceeds some threshold, standard cell rebalancing operations may be performed to reduce the difference. For example, all the cells may be discharged to a target value and then charged, etc. As such, an accurate measure of cell voltage, including the voltage of the so-called pack top cell (e.g., Cn, Cn', Cn")

may improve the effectiveness of pack rebalancing activities as well as other battery related functions such as charging, discharging, etc.

Figure 4:
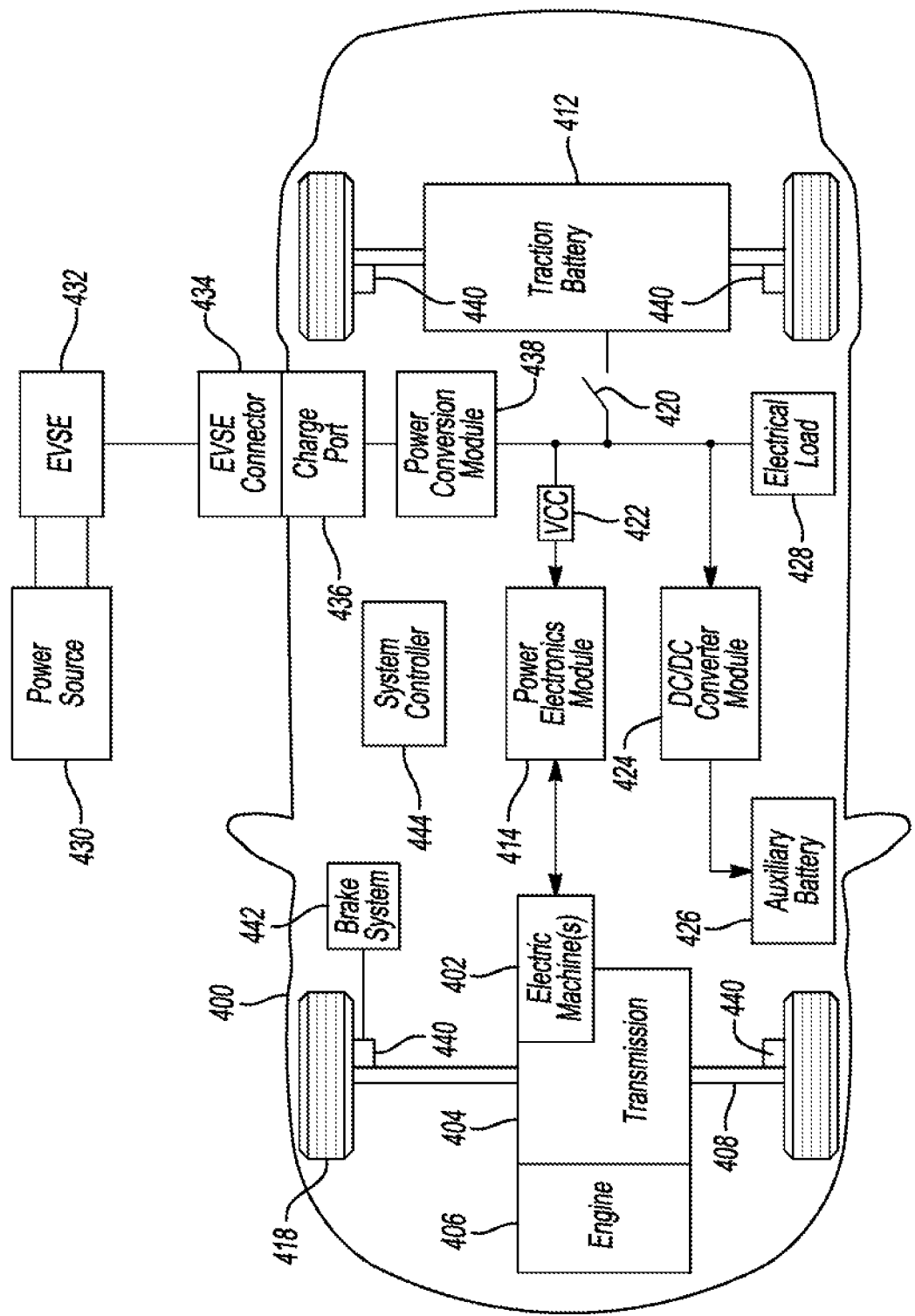
FIG. 4 is a block diagram of an automotive vehicle.

Referring to FIG. 4, the battery systems contemplated herein may be implemented within the context of a vehicle 400, which in this example is a plug-in hybrid-electric vehicle. The vehicle 400 may comprise one or more electric machines 402 mechanically coupled to a hybrid transmission 404. The electric machines 402 may be capable of operating as a motor or generator. In addition, the hybrid transmission 404 is mechanically coupled to an engine 406. The hybrid transmission 404 is also mechanically coupled to a drive shaft 408 that is mechanically coupled to wheels 418. The electric machines 402 can provide propulsion and slowing capability when the engine 406 is turned on or off. The electric machines 402 may also act as generators and can provide fuel economy benefits by recovering energy that would normally be lost as heat in a friction braking system. The electric machines 402 may also reduce vehicle emissions by allowing the engine 406 to operate at more efficient speeds and allowing the hybrid-electric vehicle 400 to be operated in electric mode with the engine 406 off under certain conditions. The vehicle 400 may also be a battery electric vehicle. In this configuration, the engine 406 may not be present. In other configurations, the vehicle 400 may be a full hybrid-electric vehicle without plug-in capability.

A traction battery or battery pack 412 stores energy that can be used by the electric machines 402. The vehicle battery pack 412 may provide a high voltage direct current (DC) output. The traction battery 412 may be electrically coupled to one or more power electronics modules 414. One or more contactors 420 may isolate the traction battery 412 from other components when opened and connect the traction battery 412 to other components when closed. The power electronics module 414 is also electrically coupled to the electric machines 402 and provides the ability to bi-directionally transfer energy between the traction battery 412 and electric machines 402. For example, the traction battery 412 may provide a DC voltage while the electric machines 402 may operate with a three-phase alternating current (AC) to function. The power electronics module 414 may convert the DC voltage to a three-phase AC current to operate the electric machines 402. In a regenerative mode, the power electronics module 414 may convert the three-phase AC current from the electric machines 402 acting as generators to the DC voltage compatible with the traction battery 412.

The vehicle 400 may include a variable-voltage converter (VVC) 422 electrically coupled between the traction battery 412 and power electronics module 414. The VVC 422 may be a DC/DC boost converter configured to increase or boost the voltage provided by the traction battery 412. By increasing the voltage, current requirements may be decreased leading to a reduction in wiring size for the power electronics module 414 and electric machines 402. Further, the electric machines 402 may be operated with better efficiency and lower losses.

In addition to providing energy for propulsion, the traction battery 412 may provide energy for other vehicle electrical systems. The vehicle 400 may include a DCDC converter module 424 that converts high voltage DC output of the traction battery 412 to a low voltage DC supply that is compatible with low-voltage vehicle loads. An output of the DC/DC converter module 424 may be electrically coupled to an auxiliary battery 426 (e.g., 12V battery) for charging the auxiliary battery 426. The low-voltage systems may be electrically coupled to the auxiliary battery 426. One or more electrical loads 428 may be coupled to the high-voltage bus. The electrical loads 428 may have an associated controller that operates and controls the electrical loads 428 when appropriate. Examples of electrical loads 428 may be a fan, an electric heating element, and/or an air-conditioning compressor.

The vehicle 400 may be configured to recharge the traction battery 412 from an external power source 430. The external power source 430 may be a connection to an electrical outlet. The external power source 430 may be electrically coupled to a charger or electric vehicle supply equipment (EVSE) 432. The external power source 432 may be an electrical power distribution network or grid as provided by an electric utility company. The EVSE 432 may provide circuitry and controls to regulate and manage the transfer of energy between the power source 430 and vehicle 400. The external power source 430 may provide DC or AC electric power to the EVSE 432. The EVSE 432 may have a charge connector 434 for plugging into a charge port 436 of the vehicle 400. The charge port 436 may be any type of port configured to transfer power from the EVSE 432 to the vehicle 400. The charge port 436 may be electrically coupled to a charger or on-board power conversion module 438. The power conversion module 438 may condition the power supplied from the EVSE 434 to provide the proper voltage and current levels to the traction battery 412. The power conversion module 438 may interface with the EVSE 432 to coordinate the delivery of power to the vehicle 400. The EVSE connector 434 may have pins that mate with corresponding recesses of the charge port 436. Alternatively, various components described as being electrically coupled or connected may transfer power using a wireless inductive coupling.

One or more wheel brakes 440 may be provided for slowing the vehicle 400 and preventing motion of the vehicle 400. The wheel brakes 440 may be hydraulically actuated, electrically actuated, or some combination thereof. The wheel brakes 440 may be a part of a brake system 442. The brake system 442 may include other components to operate the wheel brakes 440. For simplicity, FIG. 4 depicts a single connection between the brake system 442 and one of the wheel brakes 440. A connection between the brake system 442 and the other wheel brakes 440 is implied. The brake system 442 may include a controller to monitor and coordinate the brake system 442. The brake system 442 may monitor the brake components and control the wheel brakes 440 for vehicle slowing. The brake system 442 may respond to driver commands and may also operate autonomously to implement features such as stability control. The controller of the brake system 442 may implement a method of applying a requested brake force when requested by another controller or sub-function.

Electronic modules in the vehicle 400 may communicate via one or more vehicle, networks. The vehicle network may include a plurality of channels for communication. One channel of the vehicle network may be a serial bus such as a Controller Area Network (CAN). One of the channels of the vehicle network may include an Ethernet network defined by Institute of Electrical and Electronics Engineers (IEEE) 802 family of standards. Additional channels of the vehicle network may include discrete connections between modules and may include power signals from the auxiliary battery 426. Different signals may be transferred over different channels of the vehicle network. For example, video signals may be transferred over a high-speed channel (e.g., Ethernet) while control signals may be transferred over CAN or discrete signals. The vehicle network may include any hardware and software components that aid in transferring signals and data between modules. The vehicle network is not shown but it may be implied that the vehicle network may connect to any electronic module that is present in the vehicle 400. A vehicle system controller (VSC) 444 may be present to coordinate the operation of the various components.

The processes, methods, or algorithms disclosed herein can be deliverable to/implemented by a processing device, controller, or computer. Which can include any existing programmable electronic control unit or dedicated electronic control unit. Similarly, the processes, methods, or algorithms can be stored as data and instructions executable by a controller or computer in many forms including, but not limited to, information permanently stored on non-writable storage media such as Read Only Memory (ROM) devices and information alterably stored on writeable storage media such as floppy disks, magnetic tapes, Compact Discs (CDs), Random Access Memory (RAM) devices, and other magnetic and optical media. The processes, methods, or algorithms can also be implemented in a software executable object. Alternatively, the processes, methods, or algorithms can be embodied in whole or in part using suitable hardware components, such as Application Specific Integrated Circuits (ASICs), Field-Programmable Gate Arrays (FPGAs), state machines, controllers or other hardware components or devices, or a combination of hardware, software and firmware components.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes may include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular applications.

What is claimed is:

1. An automotive battery system comprising:
    a battery including a plurality of cells connected in series;
    a battery management integrated circuit including a plurality of inputs each being directly electrically connected to a terminal of one of the cells via an electrical path such that a difference between voltages of an adjacent pair of the inputs corresponds to a voltage across one of the cells, wherein each of the paths includes a fuse and a resistor connected in series, wherein the battery management integrated circuit further includes a top input directly electrically connected to a positive output of the battery and configured to receive power from the battery that is defined by (i) a current having a magnitude that is at least an order of magnitude greater than current received by the inputs and (ii) a voltage equal to a sum of voltages of all the cells, wherein the battery management integrated circuit is configured to calculate a voltage difference between one of the inputs and an adjacent one of the inputs to calculate a voltage of a top cell of the battery cells and to correct the voltage of the top cell to form a corrected voltage according to the magnitude that is at least an order of magnitude greater and a predetermined resistance of the fuse in the electrical path between the top cell and the one of the inputs, wherein the battery management integrated circuit further includes a ground input, and is further configured to measure a voltage drop across a resistor in an electrical path between the ground input and a negative output of the battery, and to identify the magnitude that is at least an order of magnitude greater based on the voltage drop across the resistor in the electrical path between the ground input and the negative output of the battery, and wherein the battery management integrated circuit further includes a pair of inputs for an internal differential amplifier directly electrically connected to sides of the resistor in the electrical path between the ground input and the negative output of the battery; and
    a controller programmed to balance the cells according to the corrected voltage of the top cell.

2. The automotive battery system of claim 1, wherein the battery management integrated circuit is further configured to identify the magnitude that is at least an order of magnitude greater based on a temperature of the battery management integrated circuit.

3. The automotive battery system of claim 1, wherein the battery management integrated circuit is further configured to identify the magnitude that is at least an order of magnitude greater based on a predetermined resistance of a resistor that is series connected with the fuse in the electrical path between the top cell and the one of the inputs.

4. The automotive battery system of claim 1 further comprising an amplifier arrangement configured to measure a voltage across a resistor that is series connected with the fuse in the electrical path between the top cell and the one of the inputs, wherein the battery management integrated circuit is further configured to identify the magnitude that is at least an order of magnitude greater based on voltage across a resistor.

5. A vehicle comprising:
    a battery including a plurality of cells connected in series;
    a battery management integrated circuit including a plurality of inputs each being directly electrically connected to a terminal of one of the cells via an electrical path that includes a fuse and a resistor connected in series, wherein the battery management integrated circuit further includes a top input directly electrically connected to a positive output of the battery and configured to receive power from the battery that is defined by (i) a current having a magnitude that is at least an order of magnitude greater than current received by the inputs and (ii) a voltage equal to a sum of voltages of all the cells, wherein the battery management integrated circuit is configured to calculate a voltage difference between one of the inputs and an adjacent one of the inputs to determine a voltage of a top cell of the battery cells and to correct the voltage of the top cell to form a corrected voltage as a sum of the voltage of the top cell and a calculated voltage drop across the fuse in the electrical path between the top cell and the one of the inputs, wherein the calculated voltage drop is based on the magnitude that is at least an order of magnitude greater, wherein the battery management integrated circuit further includes a ground input, and is further configured to measure a voltage drop across a resistor in an electrical path between the ground input and a negative output of the battery, and to identify the magnitude that is at least an order of magnitude greater based on the voltage drop across the resistor in the electrical path between the ground input and the negative output of the battery, and wherein the battery management integrated circuit further includes a pair of inputs for an internal differential amplifier directly electrically connected to sides of the resistor in the electrical path between the ground input and the negative output of the battery; and a controller programmed to balance the cells according to the corrected voltage of the top cell.

6. The vehicle of claim 5, wherein the calculated voltage drop is based on the magnitude that is at least an order of magnitude greater and wherein the battery management integrated circuit is further configured to identify the magnitude that is at least an order of magnitude greater based on a temperature of the battery management integrated circuit.

7. The vehicle of claim 5, wherein the calculated voltage drop is based on the magnitude that is at least an order of magnitude greater and wherein the battery management integrated circuit is further configured to identify the magnitude that is at least an order of magnitude greater based on a predetermined resistance of a resistor that is series connected with the fuse in the electrical path between the top cell and the one of the inputs.

8. The vehicle of claim 5 further comprising an amplifier arrangement configured to measure a voltage across a resistor that is series connected with the fuse in the electrical path between the top cell and the one of the inputs, wherein the calculated voltage drop is based on the magnitude that is at least an order of magnitude greater and wherein the battery management integrated circuit is further configured to identify the magnitude that is at least an order of magnitude greater based on voltage across a resistor.

* * * * *